United States Patent [19]
Tada

[11] Patent Number: 5,684,902
[45] Date of Patent: Nov. 4, 1997

[54] SEMICONDUCTOR LASER MODULE

[75] Inventor: Hitoshi Tada, Tokyo, Japan

[73] Assignee: Mitsubishi Denki Kabushiki Kaisha, Tokyo, Japan

[21] Appl. No.: 677,208

[22] Filed: Jul. 9, 1996

[30] Foreign Application Priority Data

Feb. 13, 1996 [JP] Japan ................................. 8-025054

[51] Int. Cl.$^6$ ..................................................... G02B 6/36
[52] U.S. Cl. .................................. 385/88; 385/92; 385/49
[58] Field of Search ............................ 385/14, 49, 88–94

[56] References Cited

U.S. PATENT DOCUMENTS

| | | | |
|---|---|---|---|
| 4,750,799 | 6/1988 | Kawachi et al. | 385/14 |
| 5,544,269 | 8/1996 | Hattori | 385/88 |
| 5,559,918 | 9/1996 | Furuyama et al. | 385/92 |
| 5,562,838 | 10/1996 | Wojnarowski et al. | 385/14 |

FOREIGN PATENT DOCUMENTS

| | | |
|---|---|---|
| 62-57277 | 3/1987 | Japan . |
| 63-125908 | 5/1988 | Japan . |

OTHER PUBLICATIONS

Itoh, "Optical Device Passive Alignment Technology For Surface Mount Module", The Journal of Japan Institute for Interconnecting and Packaging Electronic Circuits, vol. 10, No. 5, 1995, pp. 302–205.

Yano, "Packaging Architecture In Lightwave Communication", The Journal of Japan Institute for Interconnecting and Packaging Electronic Circuits, vol. 10, No. 5, 1995, pp. 325–329.

Primary Examiner—John Ngo
Attorney, Agent, or Firm—Leydig, Voit & Mayer, Ltd.

[57] ABSTRACT

In a semiconductor laser module wherein a semiconductor laser chip having a light emitting facet and an optical fiber having a fiber facet are mounted on a module substrate so that the light emitting facet faces the fiber facet, the semiconductor laser chip includes semiconductor layers disposed on a semiconductor substrate and including a light emitting region, and the semiconductor substrate has a portion protruding beyond the light emitting facet. The optical fiber includes a core extending in the optical waveguide direction and a cladding part surrounding the core. In this module, positioning of the optical fiber in the optical axis direction is performed by abutting a portion of the cladding part at the fiber facet against the protruding portion of the substrate of the semiconductor laser chip. Therefore, alignment of the optical fiber with the laser chip in the optical axis direction is performed easily and accurately with a desired spacing between them, without contacting the light emitting facet of the laser chip to the fiber facet, whereby coupling efficiency between the laser chip and the optical fiber is significantly improved.

2 Claims, 6 Drawing Sheets

SEMICONDUCTOR LASER MODULE

FIELD OF THE INVENTION

The present invention relates to a semiconductor laser module wherein a semiconductor laser and an optical fiber are positioned with high accuracy.

BACKGROUND OF THE INVENTION

With the spread of optical communication system, a reduction in size and cost of a key device, that is, an optical transceiver module, has been demanded. In order to meet the demand, various semiconductor laser modules in which semiconductor lasers and optical fibers are assembled, without the need of adjustment, on accurately processed Si substrates have been proposed.

FIG. 8 is a cross-sectional view illustrating a semiconductor laser module disclosed in Japanese Published Patent Application No. Sho. 62-57277. In this semiconductor laser module, a laser chip 200 is disposed on an adjustor 111 having a V-shaped groove 140. A glass fiber 210 is put in the V-shaped groove 140 of the adjustor 111, and an end facet of the glass fiber 210 is applied to a laser facet of the laser chip 200 so that a core 230 of the fiber 210 contacts an active region 700 of the laser chip 200.

The adjustor 111 comprises a semiconductor material, such as Si and GaAs, and the V-shaped groove 140 is formed by chemical etching. The angle and depth of the V-shaped groove 140 are selected such that the position of the core 230 of the glass fiber 210 is accurately adjusted in the horizontal direction and the vertical direction. A planar portion on which the laser chip 200 is disposed is formed in the V-shaped groove 140. In addition, the laser chip 200 has a stripe-shaped mesa (not shown), and the angle of inclination at both sides of the stripe-shaped mesa is selected such that the side surfaces of the mesa closely contact the side surfaces of the V-shaped groove 140 when the laser chip 200 is mounted on the adjustor 111.

Since the semiconductor laser module is designed so that the side surfaces of the stripe-shaped mesa of the laser chip 200 closely contact the side surfaces of the V-shaped groove 140 of the adjustor 111, positioning of the laser chip 200 in the module in the horizontal direction and the vertical direction is automatically performed with accuracy when the module is assembled. Further, since the angle and depth of the V-shaped groove 140 are adjusted to the outer diameter of the glass fiber 210 in advance, positioning of the glass fiber 210 in the module in the horizontal direction and the vertical direction is automatically performed with accuracy. Further, in the direction parallel to the optical axis (hereinafter referred to as optical axis direction), alignment of the glass fiber 210 with the laser chip 200 is performed by applying the fiber facet to the laser facet. Therefore, when the semiconductor laser module is assembled, the core 230 of the glass fiber 210 is automatically aligned with the active region 700 of the laser chip 200 without the need of alignment of the glass fiber 210 and the laser chip 200 in the horizontal direction and the vertical direction.

In the prior art semiconductor laser module shown in FIG. 8, however, when the glass fiber 210 is put in the V-shaped groove 140 of the adjustor 111 to apply the fiber facet to the laser facet, these facets are unfavorably damaged, whereby the coupling efficiency between the semiconductor laser and the glass fiber is reduced.

FIG. 9 is an exploded perspective view illustrating a semiconductor laser module disclosed in "Optical Device Passive Alignment Technology for Surface Mount Module" in THE JOURNAL OF JAPAN INSTITUTE FOR INTERCONNECTING AND PACKAGING ELECTRONIC CIRCUITS, Vol.10, No.5, pp. 302–305. In this semiconductor laser module, a semiconductor laser 103 and an optical fiber 106 are disposed on an Si substrate 101 without connecting a laser facet to a fiber facet 106a. As shown by arrows in the figure, the semiconductor laser 103 is disposed on a region 103b of the Si substrate 101 where a V-shaped groove 102 is absent, and the optical fiber 106 is put in the V-shaped groove 102 so that the fiber facet 106a contacts a side surface of a rectangular groove 104.

The V-shaped groove 102 is formed by anisotropic chemical etching with a strong base etchant, such as KOH (potassium hydroxide), and the rectangular groove 104 is formed by dicing or the like at an end of the V-shaped groove 102 in the direction perpendicular to the V-shaped groove 102.

When the semiconductor laser module is assembled, positioning of the semiconductor laser 103 is performed using markers (not shown) on the semiconductor laser 103 and on the Si substrate 101, and positioning of the optical fiber 106 in the horizontal direction and the vertical direction is performed by fixing the optical fiber 106 in the V-shaped groove 102. Further, alignment of the laser facet with the fiber facet 106a in the optical axis direction is performed by applying the fiber facet 106a to the side surface of the rectangular groove 104. Therefore, when the semiconductor laser module is assembled, it is possible to automatically align the core of the optical fiber 106 with the light emitting point of the semiconductor laser 103 without the need of alignment of the semiconductor laser 103 and the optical fiber 106 in the horizontal direction and the vertical direction.

In this prior art semiconductor laser module shown in FIG. 9, although the laser facet does not contact the fiber facet, when the optical fiber 106 is put in the V-shaped groove 102 to position the fiber 106 in the optical axis direction, the fiber facet 106a is pressed against the side surface of the rectangular groove 104 several times to adjust the position of the fiber 106, whereby the fiber facet 106a is damaged, resulting in a reduction in the coupling efficiency between the semiconductor laser 103 and the optical fiber 106.

Furthermore, although the optical fiber 106 is accurately positioned by applying the fiber facet 106a to the side surface of the rectangular groove 104, since the positioning of the semiconductor laser 103 employs the markers on the semiconductor laser 103 and on the Si substrate 101, the positioning accuracy of the laser 103 depends on the positioning accuracy of the markers on the order of microns. With such a poor accuracy, sufficiently accurate positioning is not realized in the optical axis direction.

Meanwhile, another semiconductor laser module is disclosed in "Packaging Architecture in Lightwave Communication" in THE JOURNAL OF JAPAN INSTITUTE FOR INTERCONNECTING AND PACKAGING ELECTRONIC CIRCUITS, Vol.10, No.5, pp.325–329. In this semiconductor laser module, in place of the rectangular groove 104 of the laser module shown in FIG. 9a, a fiber stopper is disposed on a region where an LD is mounted, and an end facet of an optical fiber is applied to the fiber stopper, whereby alignment of the optical fiber and the LD in the optical axis direction is performed.

In this semiconductor laser module, however, since the alignment in the optical axis direction is performed by applying the fiber facet to the fiber stopper, the fiber facet is damaged, whereby the coupling efficiency between the semiconductor laser and the optical fiber is reduced.

SUMMARY OF THE INVENTION

It is an object of the present invention to provide a semiconductor laser module in which a semiconductor laser and an optical fiber are easily and accurately aligned in the optical axis direction with no damage to a laser facet or a fiber facet.

It is another object of the present invention to provide a semiconductor laser module in which the alignment in the optical axis direction is performed self-alignedly with higher accuracy.

Other objects and advantages of the present invention will become apparent from the detailed description that follows. The detailed description and specific embodiments described are provided only for illustration since various additions and modifications within the spirit and scope of the invention will be apparent to those of skill in the art from the detailed description.

According to a first aspect of the present invention, in a semiconductor laser module wherein a semiconductor laser chip having a light emitting facet and an optical fiber having a fiber facet are mounted on a module substrate so that the light emitting facet faces the fiber facet, the semiconductor laser chip comprises a plurality of semiconductor layers disposed on a semiconductor substrate and including a light emitting region, and the semiconductor substrate has a portion protruding over the light emitting facet. The optical fiber comprises a core extending in the optical waveguide direction and a cladding part surrounding the core. In this module, positioning of the optical fiber in the optical axis direction is performed by applying a portion of the cladding part at the fiber facet to the protruding portion of the substrate of the semiconductor laser chip. Therefore, alignment of the optical fiber with the laser chip in the optical axis direction is performed easily and accurately with a desired space between them, without contacting the light emitting facet of the laser chip to the fiber facet, whereby the coupling efficiency between the laser chip and the optical fiber is significantly improved.

According to a second aspect of the present invention, in the above-described semiconductor laser module, the semiconductor substrate of the laser chip has portions protruding over the light emitting facet, at both sides of the light emitting region in the direction parallel to the light emitting facet. In this case, since laser light emitted from the light emitting facet of the laser chip is not reflected by the protruding portion of the laser chip, the degree of freedom in deciding a space between the laser chip and the optical fiber is significantly increased.

According to a third aspect of the present invention, in a semiconductor laser module wherein a semiconductor laser chip having a light emitting facet and an optical fiber having a fiber facet are mounted on a module substrate so that the light emitting facet faces the fiber facet, the semiconductor laser chip comprises a plurality of semiconductor layers disposed on a semiconductor substrate and including a light emitting region, and the optical fiber comprises a core extending in the optical waveguide direction and a cladding part surrounding the core and having a portion protruding over the fiber facet. In this module, positioning of the optical fiber in the optical axis direction is performed by applying the protruding portion of the cladding part to the semiconductor substrate of the semiconductor laser chip. Therefore, alignment of the optical fiber with the laser chip in the optical axis direction is performed easily and accurately with a desired space between them, without contacting the light emitting facet of the laser chip to the fiber facet, whereby the coupling efficiency between the laser chip and the optical fiber is significantly improved.

According to a fourth aspect of the present invention, in a semiconductor laser module wherein a semiconductor laser chip having a light emitting facet and an optical fiber having a fiber facet are mounted on a module substrate so that the light emitting facet faces the fiber facet, the optical fiber has a guide means on a peripheral portion thereof, the module substrate has a groove with a guide means that fits the guide means of the optical fiber, and the optical fiber is put in the groove of the module substrate so that the guide means of the optical fiber fits the guide means of the module substrate, whereby positioning of the optical fiber in the optical axis direction is performed. In this module, the light emitting facet of the laser chip is not in contact with the fiber facet, and the optical fiber is fixed, without the need of adjustment, at a position decided in advance. Therefore, the light emitting facet and the fiber facet are not flawed, whereby the coupling efficiency between the laser chip and the optical fiber is significantly improved.

DETAILED DESCRIPTION OF THE PREFERRED EMBODIMENTS

[Embodiment 1]

Figure 1:
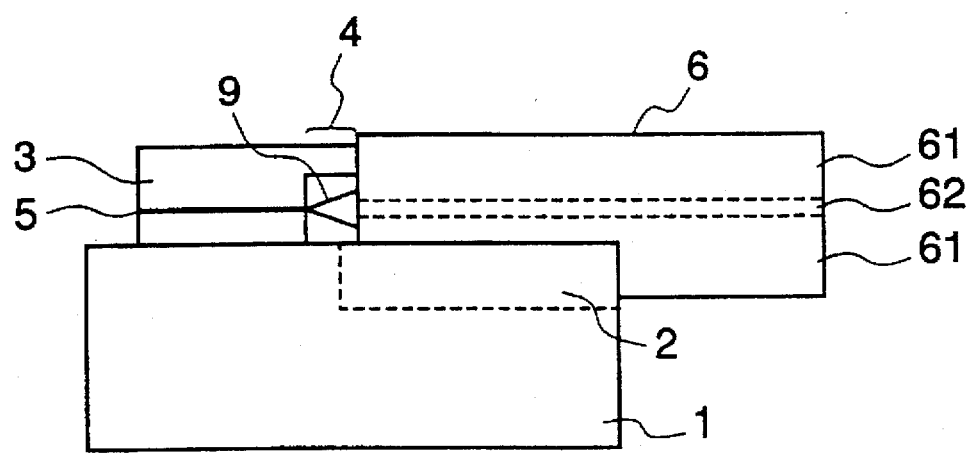
FIG. 1 is a side view illustrating a semiconductor laser module in accordance with a first embodiment of the present invention.

FIG. 1 is a side view illustrating a semiconductor laser module in accordance with a first embodiment of the present invention. In the figure, reference numeral 1 designates an Si substrate (module substrate), having a V-shaped groove 2, numeral 3 designates a semiconductor laser chip having an active layer 5 and an overhanging part 4, numeral 6 designates an optical fiber comprising a core 62 and a cladding part 61, and numeral 9, designates laser light emitted from the semiconductor laser chip 3.

A semiconductor laser module according to the first embodiment comprises an Si substrate 1 having a V-shaped groove 2, a semiconductor laser chip 3 disposed on a region of the Si substrate 1 where the groove 2 is absent with a semiconductor substrate facing upward, and an optical fiber 6 disposed in the V-shaped groove 2 of the Si substrate 1 with an end facet facing a light emitting facet of the laser chip 3. The laser chip 3 has an overhanging part 4 that protrudes from the semiconductor substrate over the light emitting facet. The optical fiber 6 is disposed so that the cladding part 61 at the fiber facet contacts the overhanging part 4 of the laser chip 3.

Figure 2:
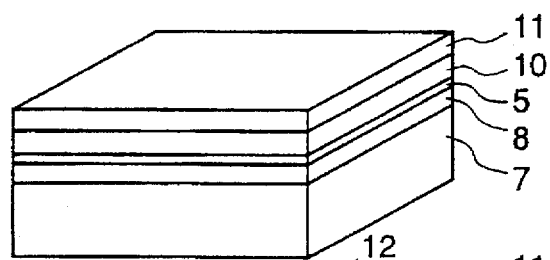
FIGS. 2(a)–2(f) are perspective views illustrating process steps in a method of fabricating a semiconductor laser employed in the semiconductor laser module shown in FIG. 1.
Figure 2:
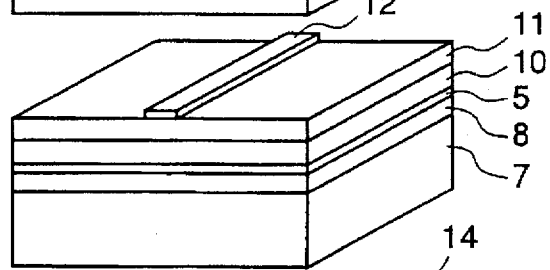
Figure 2:
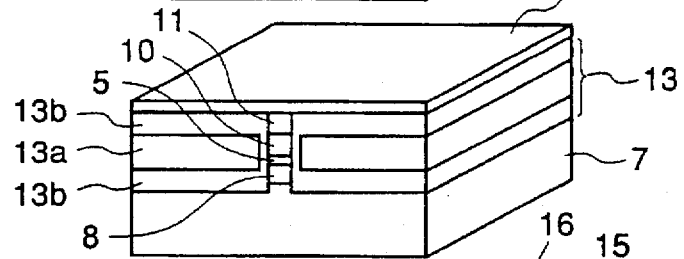
Figure 2:
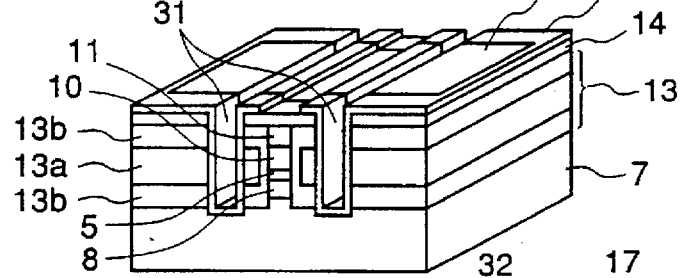
Figure 2:
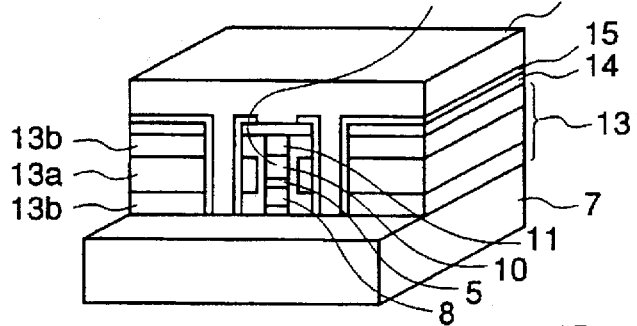
Figure 2:
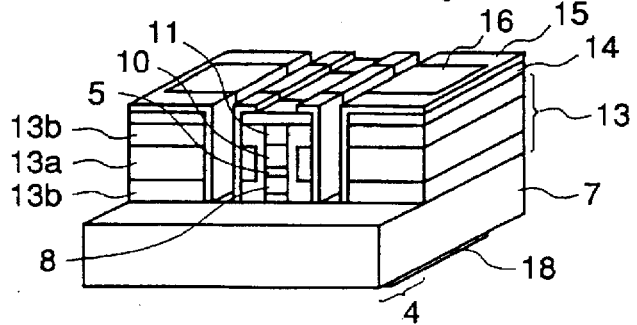

A description is given of the structure of the semiconductor laser chip 3. FIGS. 2(a)–2(f) are perspective views illustrating process steps in a method of fabricating the semiconductor laser chip 3, and FIG. 2(f) illustrates a completed structure of the laser chip 3.

As shown in FIG. 2(f), the laser chip includes a p type InP substrate 7, and a portion of the p type InP substrate 7 protrudes by a prescribed length from the laser light emitting facet. There are successively disposed on a center portion of the p type InP substrate 7, a p type InGaAsP first cladding layer 8 about 1.5 μm thick, an InP/InGaAsP active layer 5 about 0.1 μm thick, an n type InGaAsP second cladding layer 10 about 1.5 μm thick, and an n type InP first contact layer 11 about 2–3 μm thick. These layers form a stripe-shaped ridge, and current blocking structures 13, each comprising an n type InP layer 13a and upper and lower p type InP layers 13b, are disposed on opposite sides of the ridge so that the ridge is buried within the current blocking structures 13. An n type InP second contact layer 14 is disposed on the ridge and on the current blocking structures 13. Further, the laser chip 3 includes grooves 31 for reducing the capacitance at the opposite sides of and spaced apart from the stripe-shaped ridge. A surface protection film 15 comprising SiO₂ is disposed in the grooves 31 and on the second contact layer 14 except a region on the stripe-shaped ridge that serves as an optical waveguide. An n side electrode 16 is disposed on the second contact layer 14, and a p side electrode 18 is disposed on the rear surface of the substrate 1.

A description is given of the operation of the semiconductor laser.

When a forward bias voltage is applied across the p side electrode 18 and the n side electrode 16, electrons are injected into the active layer 5 through the p type InP substrate 1 and the first cladding layer 8, and holes are injected into the active layer 5 through the second contact layer 14, the first contact layer 11, and the second cladding layer 10. In the active layer 5, electrodes and holes recombine to generate induced light emission. When the amount of the injected carriers, i.e., electrons and holes, is sufficient to produce light exceeding a loss in the waveguide, laser oscillation occurs.

The process steps for fabricating the semiconductor laser chip are shown in FIGS. 2(a)–2(f).

Initially, the p type InGaAsP first cladding layer 8, the InP/InGaAsP active layer 5, the n type InGaAsP second cladding layer 10, and the n type InP contact layer 11 are successively grown on the p type InP substrate 7 (FIG. 2(a)).

Preferably, these layers are grown by MOCVD (metal organic chemical vapor deposition) or MBE (molecular beam epitaxy) at a growth temperature in a range from 600° C. to 700° C.

Thereafter, an insulating film, such as SiO₂, is deposited to a thickness of about 100 nm by sputtering or CVD and patterned to form a stripe 12 having a width of about 5 μm (FIG. 2(b)).

In the step of FIG. 2(c), using the stripe-shaped insulating film 12 as a mask, the semiconductor layers on the InP substrate 7 are etched with an etchant containing hydrogen bromide or bromine to form a stripe-shaped ridge that provides an optical waveguide. Thereafter, the current blocking structure 13 comprising an n type InP layer 13a and upper and lower p type InP layers 13b is produced on both sides of the ridge. After removal of the insulating film 12, the n type InP second contact layer 14 is grown over the entire surface.

In the step of FIG. 2(d), in order to reduce the capacitance of the semiconductor laser chip, portions of the current blocking structure 13 on both sides of and spaced apart from the stripe-shaped ridge are etched to a depth exceeding the pn junction between the n type InP layer and the lower p type InP layer 13b. Thereafter, SiO₂ or the like is deposited over the entire surface to form the surface protection film 15, and a portion of the surface protection film 15 on the top of the stripe-shaped ridge is removed. Thereafter, the n side electrode 16 is formed on the surface protection film 15 and on the top of the stripe-shaped ridge.

In the step of FIG. 2(e), a resist pattern 17 is formed on a prescribed region of the structure, and the semiconductor layers on the substrate 7 are dry-etched with a gas containing methane and hydrogen, using the resist pattern 17 as a mask, thereby producing a laser light emitting facet 32.

Thereafter, the p type InP substrate 7 is ground at the rear surface to a thickness of 100 μm, and a metal is deposited on the rear surface of the substrate 7 and patterned to produce the p side electrode 18. Simultaneously with the formation of the p side electrode 18, markers for positioning of the laser chip when the laser chip is bonded to the Si substrate 1 and markers showing a cleavage position are formed on the rear surface of the substrate 7 by patterning the metal of the electrode 18. Finally, the p type InP substrate 7 is cleaved according to the markers for cleaving, resulting in a semiconductor laser chip (FIG. 2(f)).

In this method, since the p type InP substrate 7 is cleaved using the markers for cleaving, the length of the overhanging part 4 can be decided with high accuracy. Since an ordinary InP series laser with a buried ridge structure emits laser light at an angle of about 30 degrees, the length of the overhanging part 4 must be selected such that the emitted laser light does not hit the overhanging part 4. For example, when the depth of the dry etching for forming the light emitting facet 32 is 5 μm from the active layer 5, the length of the overhanging part 4 must be shorter than about 20 μm. When the coupling efficiency between the laser chip 3 and the optical fiber 6 is considered, the length of the overhanging part 4 is desired to be as short as possible.

On the other hand, as shown in FIG. 1, the optical fiber 6 comprises a core 62 receiving laser light 4 emitted from the semiconductor laser chip 3 and a cladding part 61 surrounding the core 62 and having a refractive index smaller than that of the core 62. The laser light 4 emitted from the laser chip 3 is transmitted through the core 62 of the optical fiber 6. In this first embodiment of the invention, a conventional optical fiber is used as the optical fiber 6.

Figure 3:
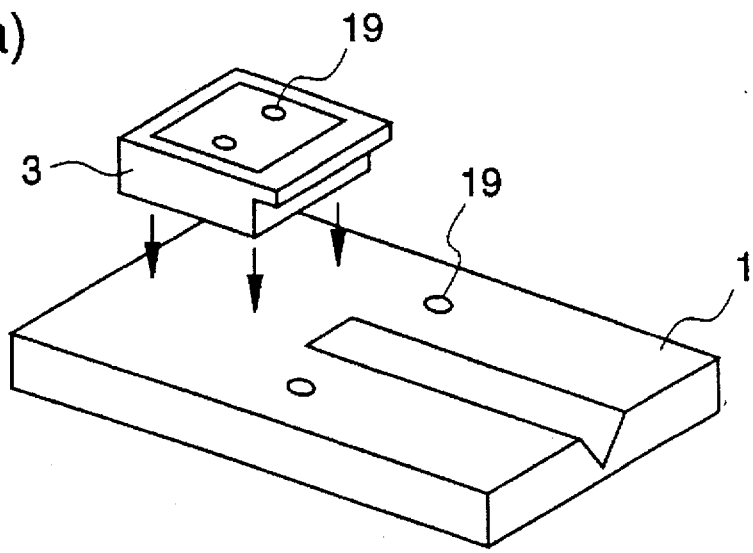
FIGS. 3(a)–3(c) are perspective views illustrating process steps in a method of assembling the semiconductor laser module shown in FIG. 1.
Figure 3:
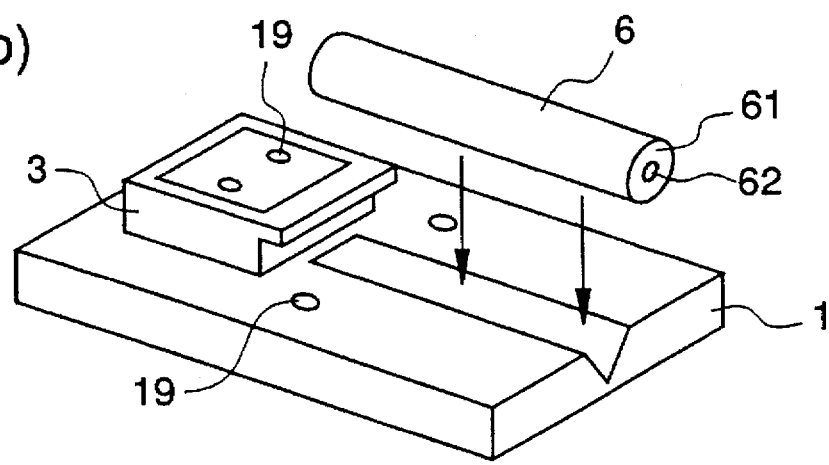
Figure 3:
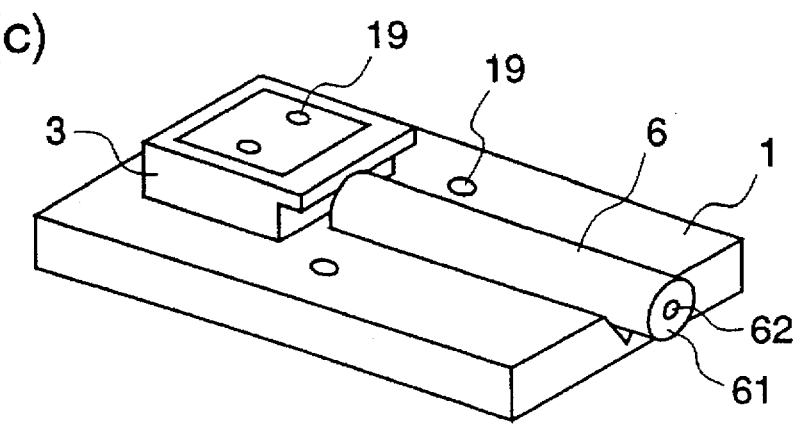

FIGS. 3(a)-3(c) are perspective views illustrating a method of assembling a semiconductor laser module according to the first embodiment of the invention.

Initially, as illustrated in FIG. 3(a), positioning of the semiconductor laser chip 3 on the Si substrate 1 is performed using markers 19 on the substrate and on the laser chip 3, with the n side electrode 16 of the laser chip 3 facing the Si substrate 1 and, thereafter, the semiconductor laser chip 3 is bonded to the Si substrate 1 (FIG. 3(a)). Then, the optical fiber 6 is put in the V-shaped groove 2 of the Si substrate 1 (FIG. 3(b)), and the cladding part 61 at the end facet of the optical fiber 6 is applied to the overhanging part 4 of the laser chip 3 (FIG. 3(c)). Finally, the optical fiber 6 is fixed to the Si substrate 1 with an adhesive. In this way, a semiconductor laser module shown in FIG. 1 is completed.

In the semiconductor laser module according to the first embodiment, the position of the optical fiber 6 in the horizontal direction and the vertical direction is decided by the configuration of the V groove 2, and the position of the optical fiber 6 in the optical axis direction is decided self-alignedly by the length of the overhanging part 4 of the laser chip 3 which is formed in advance whereas it is decided by a rectangular groove or a fiber stopper in the prior art semiconductor laser module. Therefore, the space between the active layer 5 of the laser chip 3 and the end facet of the optical fiber 6 depends on the precision of the photolithographic techniques for forming the overhanging part 4, so that it is decided with a precision on the order of nanometer. As a result, the optical fiber 6 is accurately aligned with the semiconductor laser chip 3 in the optical axis direction while maintaining a desired space between the active layer 5 of the laser chip 3 and the end facet of the optical fiber 6. Furthermore, since the alignment in the optical axis direction is performed by just applying the end facet of the optical fiber 6 to the overhanging part 4 of the laser chip 3 and no adjustment is necessary, the light emitting facet of the laser chip 3 is not damaged by the optical fiber 6, resulting in a semiconductor laser module having a high coupling efficiency between a semiconductor laser and an optical fiber.

[Embodiment 2]

Figure 4:
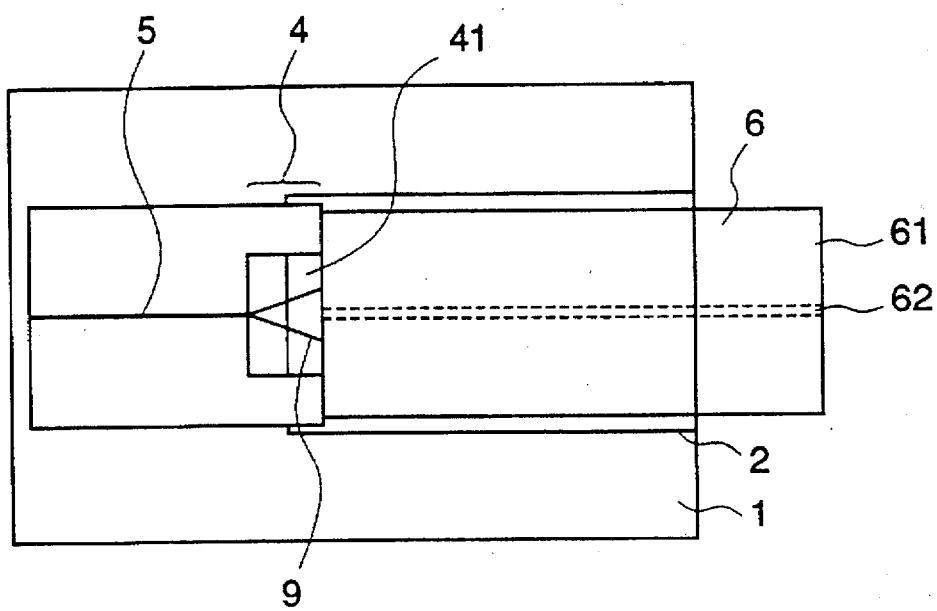
FIG. 4 is a plan view illustrating a semiconductor laser module in accordance with a second embodiment of the present invention.
Figure 5:
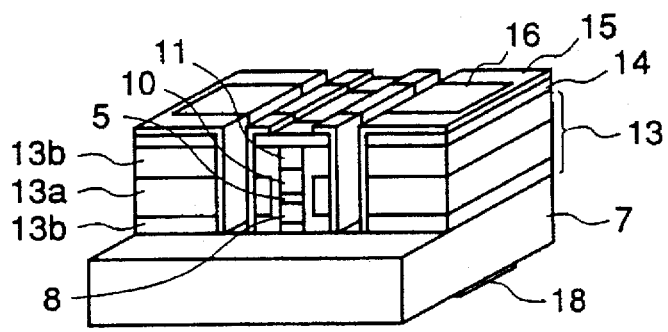
FIGS. 5(a) and 5(b) are perspective views illustrating process steps in a method of fabricating a semiconductor laser employed in the semiconductor laser module shown in FIG. 4.
Figure 5:
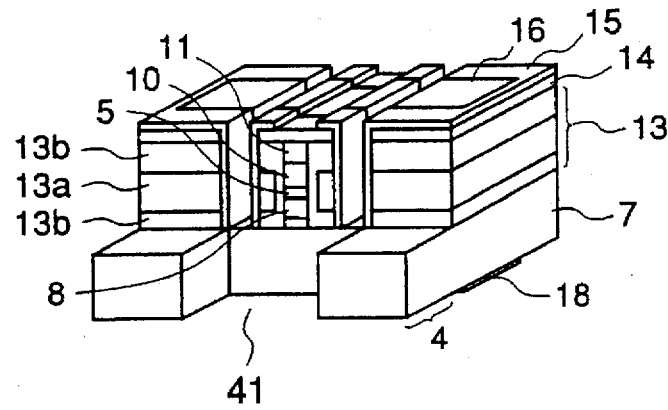

FIG. 4 is a plan view illustrating a semiconductor laser module in accordance with a second embodiment of the present invention. FIGS. 5(a) and 5(b) are perspective views illustrating process steps in a method of fabricating a semiconductor laser chip according to the second embodiment of the present invention.

In the semiconductor laser module according to this second embodiment, as shown in FIG. 5(b), an overhanging part 4 of the semiconductor laser chip has an opening 41 in the center opposite the stripe-shaped ridge, in other words, two overhanging parts 4 protrude from the laser light emitting facet at both sides of the stripe-shaped ridge.

A description is given of the fabrication process.

As illustrated in FIG. 5(a), a laser light emitting facet is produced by dry etching of the structure to a depth exceeding the active layer 5, as already described with respect to FIG. 2(e). Thereafter, as illustrated in FIG. 5(b), a portion of the overhanging part 4 in the vicinity of the active layer 5 is etched and removed with an etchant containing hydrochloric acid to form an opening 41.

A semiconductor laser module according to this second embodiment is assembled as follows. After the semiconductor laser chip 3 is bonded to the Si substrate 1, the optical fiber 6 is put in the V-shaped groove 2 so that an end facet thereof contacts the overhanging part 4 of the laser chip 3, and the optical fiber 6 is fixed to the Si substrate 1. The method of bonding the laser chip 3 onto the Si substrate 1 is identical to the method described in the first embodiment of the invention.

In the semiconductor laser module according to the second embodiment of the invention, the position of the optical fiber 6 in the horizontal direction and the vertical direction is decided by the configuration of the V groove 2, and the position of the optical fiber 6 in the optical axis direction is decided self-alignedly by the length of the overhanging part 4 of the laser chip 3 which is formed in advance whereas it is decided by a rectangular groove or a fiber stopper in the prior art semiconductor laser module. Therefore, the optical fiber 6 is accurately aligned with the semiconductor laser chip 3 while maintaining a desired space between the active layer 5 of the laser chip 3 and the end facet of the optical fiber 6.

In the semiconductor laser module according to the first embodiment shown in FIG. 1, when the length of the overhanging part 4 is increased, laser light 9 emitted from the active layer 5 of the laser chip 3 is irregularly reflected by the overhanging part 4, resulting in a reduction in the coupling efficiency between the laser chip 3 and the optical fiber 6 and a generation of noise. In the semiconductor laser module according to this second embodiment, however, since the overhanging part 4 of the semiconductor laser chip 3 has the opening 41, unwanted reflection of laser light 9 at the overhanging part 4 is avoided with high reliability. Therefore, the degree of freedom in design of the space between the semiconductor laser chip 3 and the optical fiber 6 is increased.

[Embodiment 3]

Figure 6:
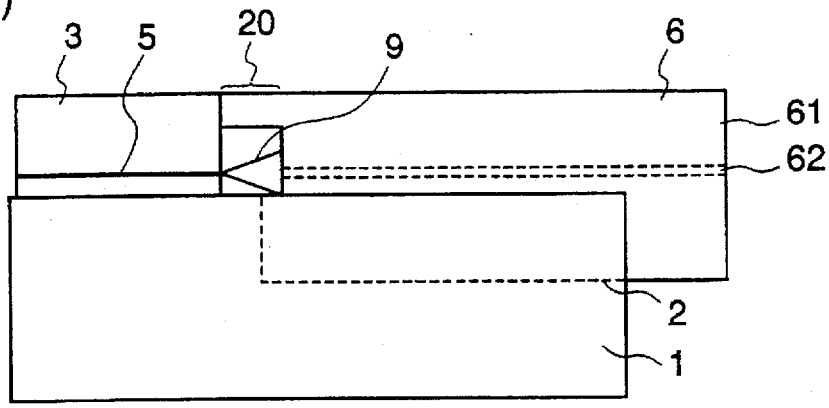
FIG. 6(a) is a side view illustrating a semiconductor laser module in accordance with a third embodiment of the present invention.
FIG. 6(b) is a perspective view illustrating a tip of an optical fiber employed in the semiconductor laser module shown in FIG. 6(a).
Figure 6:
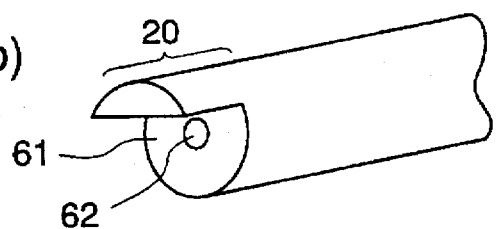

FIG. 6(a) is a side view illustrating a semiconductor laser module according to a third embodiment of the present invention, and FIG. 6(b) is a perspective view illustrating a tip of an optical fiber employed in the semiconductor laser module shown in FIG. 6(a). In these figures, reference numeral 20 designates an overhanging part of the optical fiber.

The semiconductor laser module according to this third embodiment comprises an Si substrate 1 having a V-shaped groove 2, a semiconductor laser chip 3 disposed on the Si substrate 1 with a semiconductor substrate facing upward, and an optical fiber 6 put in the V-shaped groove 2 of the Si substrate 1 with an end facet facing a light emitting facet of the laser chip 3. The optical fiber 6 has an overhanging part 20, i.e., a portion of the cladding part 61 protruding over the fiber facet, and positioning of the optical fiber 6 in the optical axis direction is performed by applying the overhanging part 20 to the semiconductor substrate of the laser chip 3.

The overhanging part 20 of the optical fiber 6 is produced by mechanically cutting the tip of the optical fiber 6, leaving a portion of a desired length protruding over the fiber facet. The length of the overhanging part 20 must be selected such that laser light 9 emitted from the laser chip 3 does not hit the overhanging part 20.

A semiconductor laser module according to this third embodiment is assembled as follows. After the semiconductor laser chip 3 is bonded to the Si substrate 1, the optical fiber 6 is put in the V-shaped groove 2 so that the overhanging part 20 of the optical fiber 6 contacts the p type InP substrate 7 of the laser chip 3, and the optical fiber 6 is fixed to the Si substrate 1 with an adhesive. The method of bonding the laser chip 3 onto the Si substrate 1 is identical to the method described in the first embodiment of the invention.

In the semiconductor laser module according to this third embodiment, since the space between the semiconductor laser chip 3 and the optical fiber 6 in the optical axis direction is decided by the length of the overhanging part 7 of the optical fiber 6, alignment of the optical fiber 6 with the laser chip 3 in the optical axis direction is performed self-alignedly.

The shape of the overhanging part 20 of the optical fiber 6 is not restricted to that shown in FIG. 6(b). For example, the overhanging part may be rectangle, or an opening may be formed in the center of the overhanging part.

[Embodiment 4]

Figure 7:
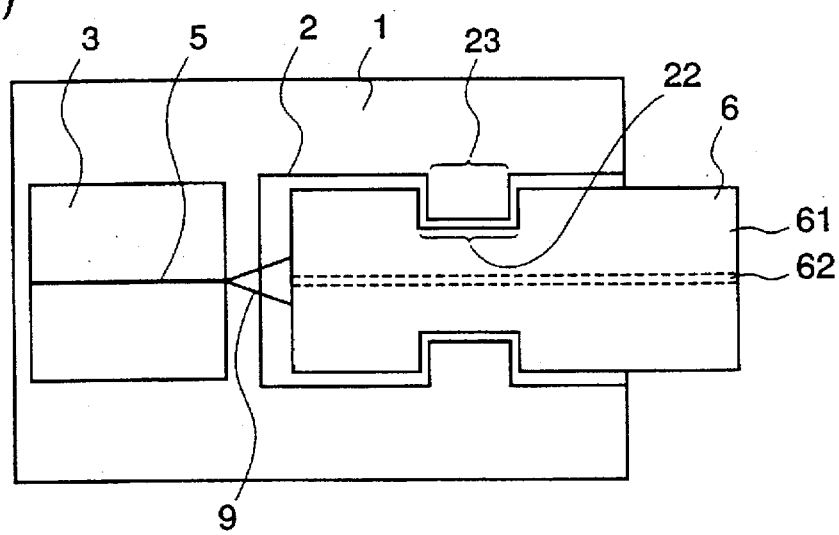
FIG. 7(a) is a plan view illustrating a semiconductor laser module in accordance with a fourth embodiment of the present invention.
FIGS. 7(b) and 7(c) are perspective views, each illustrating a tip of an optical fiber employed in the semiconductor laser module shown in FIG. 7(a).
Figure 7:
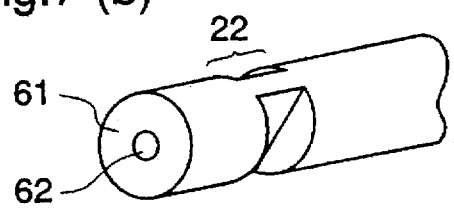
Figure 7:
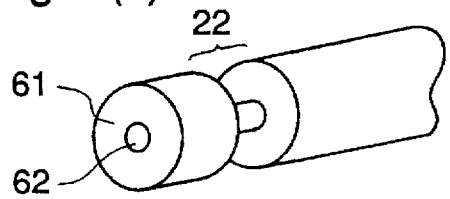
Figure 8:
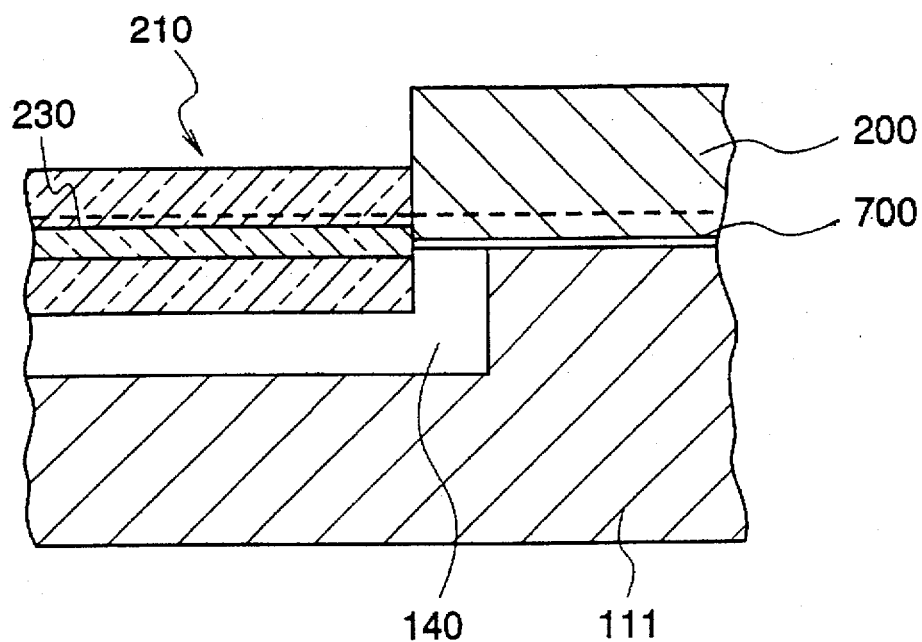
FIG. 8 is a cross-sectional view illustrating a semiconductor laser module according to the prior art.
Figure 9:
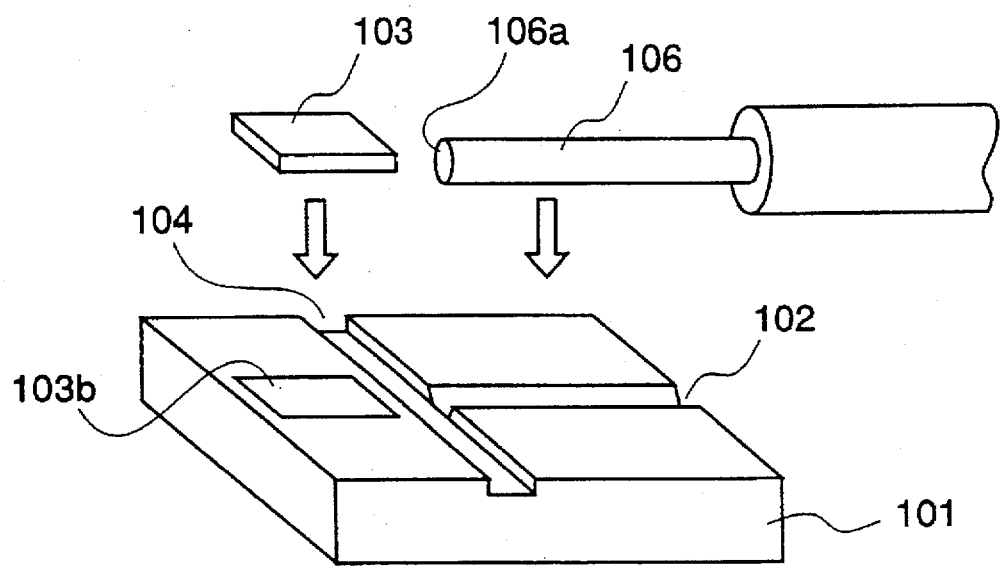
FIG. 9 is an exploded perspective view illustrating a semiconductor laser module according to the prior art.

FIG. 7(a) is a plan view illustrating a semiconductor laser module in accordance with a fourth embodiment of the present invention, and FIGS. 7(b) and 7(c) are perspective views illustrating tips of optical fibers employed in the semiconductor laser module shown in FIG. 7(a). In these figures, reference numeral 22 designates a guide groove of the optical fiber 6, and numeral 23 designates a guide groove of the Si substrate 1.

As shown in FIG. 7(a), a semiconductor laser module according to this fourth embodiment comprises an Si substrate 1 having a V-shaped groove 2, a semiconductor laser chip 3 disposed on the Si substrate 1 with a p type InP substrate facing upward, and an optical fiber 6 put in the V-shaped groove of the Si substrate 1 with an end facet facing a light emitting facet of the laser chip 3. The optical fiber 6 has a guide groove 22 at the periphery, and the Si substrate 1 has a guide groove 23 that fits the guide groove 22 of the optical fiber 6.

The guide groove 22 of the optical fiber 6 is formed by mechanically cutting a peripheral portion of the optical fiber 6 as shown in FIG. 7(b). Alternatively, it may be formed by partially reducing the diameter of the optical fiber 6 as shown in FIG. 7(c). The guide groove 23 of the Si substrate 1 is formed by conventional photolithographic techniques.

A semiconductor laser module according to this fourth embodiment is assembled as follows. That is, after the semiconductor laser chip 3 is bonded to the Si substrate 1, the optical fiber 6 is put in the V-shaped groove 2 of the Si substrate 1 so that the guide groove 22 of the optical fiber 6 fits the guide groove 23 in the V-shaped groove 2 of the Si substrate 1. The method of bonding the laser chip 3 onto the Si substrate 1 is identical to the method already described in the first embodiment of the invention.

Since the semiconductor laser module according to this fourth embodiment is assembled without contacting the fiber facet to the light emitting facet of the laser chip, the light emitting facet and the fiber facet are not damaged. Further, the guide groove 23 is formed in the Si substrate 1 by conventional photolithographic techniques with a precision on the order of nanometers, and bonding markers for the semiconductor laser chip 3 are formed on the Si substrate 1 simultaneously with the guide groove 23, so that the semiconductor laser chip 3 is aligned with the guide groove 23 of the Si substrate 1 with a precision on the order of microns. In this semiconductor laser module, the optical fiber 6 is fixed, without the need of adjustment, to a position decided in advance, and the semiconductor laser chip 3 is positioned using the markers on the Si substrate 1. Therefore, alignment of the optical fiber 6 with the semiconductor laser chip 3 in the optical axis direction is easily performed with high accuracy, whereby the coupling efficiency between the semiconductor laser chip 3 and the optical fiber 6 is increased.

Meanwhile, Japanese Published Patent Application No. Sho. 63-125908 discloses an optical connector in which coupling of an optical connector ferrule is realized using a guide pin. In this optical connector, at least a part in the center of the guide pin is constricted, i.e., has a diameter smaller than the diameter of the guide pin, and at least a portion of the constricted part of the guide pin is positioned at a coupling part of the optical connector ferrule. However, the object of this optical connector is to realize a stable and low-loss coupling by making a clearance due to coupling of the guide pin and a guide pin hole zero or significantly reducing the clearance, using a deformation absorbing region produced in the axis direction. Therefore, the optical connector disclosed in this publication has no relation to the semiconductor laser module according to the fourth embodiment of the invention.

While in the first to fourth embodiments of the present invention the semiconductor laser chip 3 includes a p type InP substrate, an n type InP substrate may be used in place of the p type InP substrate. Further, a similar laser structure can be fabricated using a GaAs substrate.

Further, although a gas mixture containing methane and hydrogen is used in the dry etching process for forming the light emitting facet of the laser chip 3, other gases, for example, ethane or propane, may be employed in place of methane as long as a similar shape of the facet is obtained.

Furthermore, although the markers 19 on the semiconductor laser chip 3 are formed by patterning a metal, markers may be formed by etching the p type InP substrate 7.

Furthermore, in the first to third embodiments of the invention, since the length of the overhanging part 4 of the laser chip 3 depends on the laser light emitting angle, the length of the overhanging part 4 can be increased when a laser chip with a small light emitting angle is employed.

What is claimed is:

1. A semiconductor laser module wherein a semiconductor laser chip having a light emitting facet and an optical fiber having a fiber facet are mounted on a module substrate so that the light emitting facet faces the fiber facet, the semiconductor laser module comprising:

a semiconductor laser chip comprising a plurality of semiconductor layers disposed on a semiconductor substrate and including a light emitting region, the semiconductor substrate having a portion protruding beyond the light emitting facet, the protruding portion including a central gap aligned with the light emitting region; and an optical fiber comprising a core extending in an optical waveguide direction and a cladding part surrounding the core, the optical fiber being positioned in an optical axis direction by abutting a portion of the cladding part at the fiber facet against the protruding portion of the substrate of the semiconductor laser chip.

2. The semiconductor laser module of claim 1 wherein the semiconductor substrate of the laser chip has portions protruding beyond the light emitting facet, at opposite sides of the light emitting region parallel to the light emitting facet.

* * * * *